United States Patent [19]
Aoki

[11] Patent Number: 5,214,303
[45] Date of Patent: May 25, 1993

[54] SEMICONDUCTOR DEVICE ROM HAVING AN OFFSET REGION

[75] Inventor: Hitoshi Aoki, Nara, Japan

[73] Assignee: Sharp Kabushiki Kaisha, Osaka, Japan

[21] Appl. No.: 826,998

[22] Filed: Jan. 28, 1992

[30] Foreign Application Priority Data

Feb. 8, 1991 [JP] Japan .................................. 2-17788

[51] Int. Cl.$^5$ .................. G11C 17/00; H01L 27/10; H01L 29/06
[52] U.S. Cl. .................................. 257/390; 257/622; 257/387; 365/104
[58] Field of Search ................. 357/55, 23.4, 45; 365/104; 257/390, 622, 387

[56]  References Cited
U.S. PATENT DOCUMENTS 4,380,866  4/1983  Countryman, Jr. et al. .......... 357/91
4,964,080  10/1990  Tzeng ................................ 357/23.5

FOREIGN PATENT DOCUMENTS 63-90853  4/1988  Japan .................................... 357/55

Primary Examiner—Rolf Hille
Assistant Examiner—Robert Limanek
Attorney, Agent, or Firm—Nixon & Vanderhye

[57]  ABSTRACT

A semiconductor device including: a semiconductor substrate, a gate electrode formed on the substrate, a pair of source/drain regions provided in the substrate, and an offset step portion formed in at least one of the source/drain regions and downwardly extending into the substrate in the vicinity of the gate electrode.

9 Claims, 3 Drawing Sheets

SEMICONDUCTOR DEVICE ROM HAVING AN OFFSET REGION

FIELD OF THE INVENTION

This invention relates to a semiconductor device and, more particularly to a mask ROM having 2-bit memory cells and a fabrication method therefor.

DESCRIPTION OF THE RELATED ART

In one example of a 2-bit memory cell for a mask ROM, an offset region is provided between a gate electrode and source/drain regions in a MOS transistor to make the transistor have a directional conduction property, thereby allowing a 2-bit memory operation.

Such a transistor is illustrated in FIGS. 5–7. Referring to FIG. 5, the transistor comprises a semiconductor substrate 61 of a first conductivity type, impurity regions 62a (62c) and 62b (62d) of a second conductivity type formed as source/drain regions in the substrate 61, a gate oxide 63 formed on the substrate and a gate electrode 64 formed on the gate oxide 63 existing between the source/drain regions. In this example, the gate oxide is provided at least just under the gate electrode 64, and the gate electrode overlaps one (62a) of the source/drain regions and is spaced apart by a predetermined distance 1 from the other (62b) of the regions.

With the transistor thus arranged, when the region 62a is used as source and the region 62b as drain as shown in FIG. 6, the offset region F is applied with a high electric field to form a depletion layer 66, with the result that there occurs electric conduction between a channel region 67 and the drain region 62b. On the other hand, when the region 62c is used as drain and the region 62d as source as shown in FIG. 7, the depletion layer 66 as in FIG. 6 is not formed, resulting in no conduction between the source region 62d and the channel region 67.

The above method can realize the following four conduction states:

i) the gate electrode overlaps both the source and drain regions, leading to both forward and backward conductions;

ii) the gate electrode overlaps the source region only, leading to forward conduction and no backward conduction;

iii) the transistor overlaps the drain region only, leading to backward conduction and no forward conduction; and iv) the gate electrode does not overlap the source region nor drain region, leading to no conduction in any direction.

Thus, 2-bit information can be read out from one memory cell transistor by applying voltage in two directions (in forward and backward directions).

Such a memory cell, however, suffers from the following drawbacks:

(a) an offset region must be provided in a layout design, resulting in an increased cell size;

(b) information must be written during source/drain doping before the gate electrode formation, causing prolonged period of time for mask ROM fabrication; and (c) a self-alignment technique using a gate electrode as a mask for the source/drain doping cannot be applicable, resulting in an increased cell size by a play margin for alignment. Further, possible misalignment makes the resulting memory cell transistor instable, causing insufficient conduction or incomplete non-conduction.

SUMMARY OF THE INVENTION

The present invention has been accomplished in view of the foregoing situation and aims to overcome the above-mentioned drawbacks.

Thus, the present invention provides a semiconductor device comprising: a semiconductor substrate, a gate electrode formed on the substrate, a pair of source/drain regions provided in the substrate, and an offset step portion formed in at least one of the source/drain regions and downwardly extending into the substrate in the vicinity of the gate electrode.

The invention also provides a process for fabricating a semiconductor device comprising the steps of: (i) forming a resist pattern on a semiconductor substrate having a gate electrode for providing an information-writing region;

(ii) forming an offset step portion in the vicinity of the gate electrode by cutting downwardly into the semiconductor substrate in at least one of source/drain regions to be formed, with use of the resist pattern and the gate electrode as a mask; and (iii) removing the resist pattern and then implanting impurity ions into the source/drain regions to be formed with use of the gate electrode as a mask so as to form a pair of the source/drain regions, whereby at least one of the source/drain regions is provided with the offset step portion at a location adjacent the electrode.

DETAILED DESCRIPTION OF THE PREFERRED EMBODIMENTS

The main feature of the invention consists in that an offset region is vertically provided as an offset step portion by cutting downwardly a portion of at least one of intended source/drain regions at a location adjacent a gate electrode with use of a resist pattern and the gate electrode as a mask, and thereafter the intended source/drain regions are doped with an impurity by ion-implantation. A depth of said offset step portion is preset to be smaller than a depth that impurity diffusion for forming the source/drain regions can be diffused in said semiconductor substrate.

This arrangement enables to overcome the above-mentioned problems; that is:

(a) an offset region in a layout design is no longer needed;

(b) information can be written after the formation of the gate electrode; and (c) a self-alignment technique can be employed for forming the source/drain regions.

Figure 4:
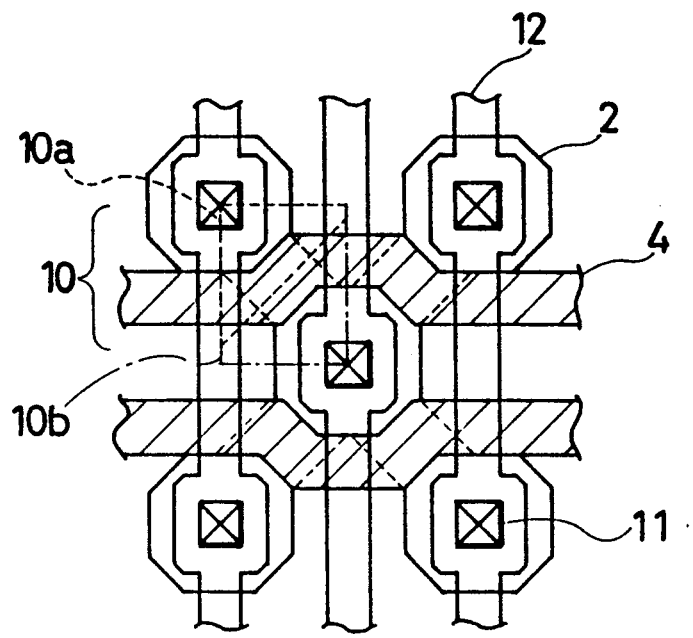
FIG. 4 is a plan view showing a layout of a memory cell according to the embodiment of the invention.
Figure 5:
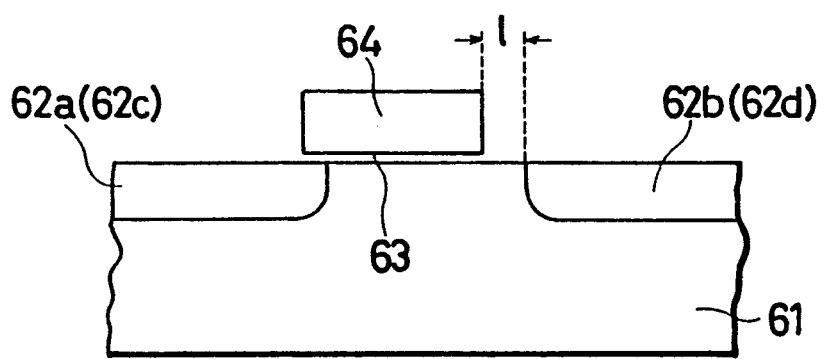
FIG. 5 is a schematic illustration of a conventional 2-bit memory cell.
Figure 6:
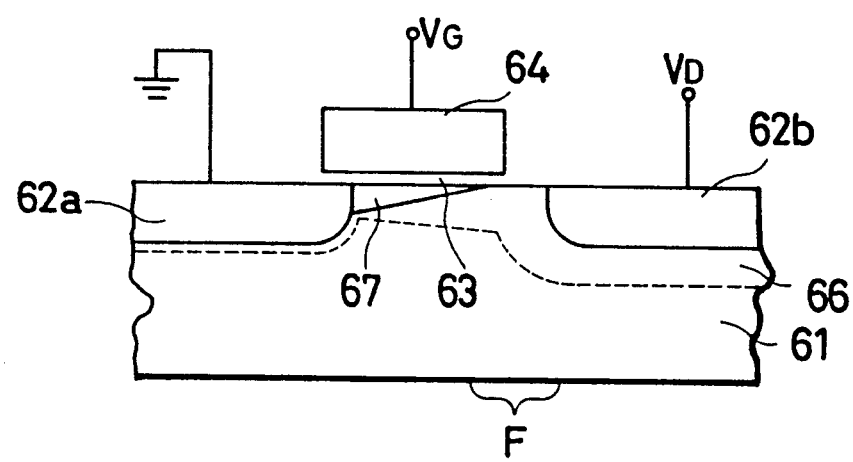
FIG. 6 is a schematic illustration showing a function of the conventional 2-bit memory cell.
Figure 7:
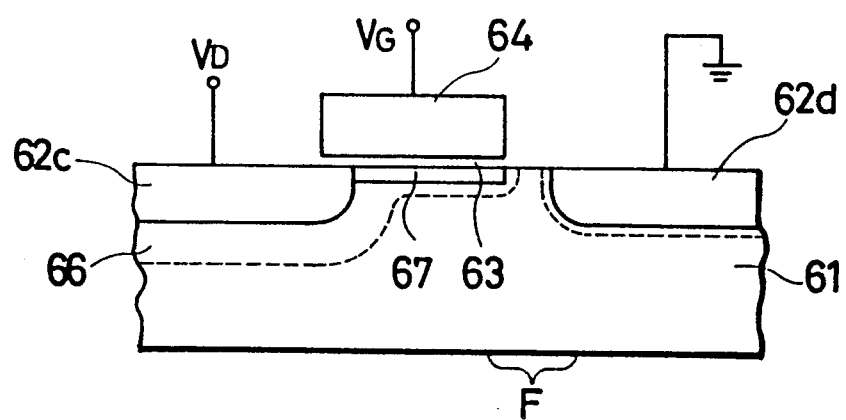
FIG. 7 is a schematic illustration showing another function of the conventional 2bit memory cell.

As shown in FIG. 4, an offset step portion is formed by dividing a memory cell 10 into two regions 10a and 10b encompassed by a thick broken line and a chain line, respectively and cutting a semiconductor substrate downwardly in an intended source/drain region 2 existing within either of the two regions 10a and 10b, with use of a gate electrode (word line) as a mask. Thus, the memory cell is ready to be written with 2-bit information. Accordingly, with such a memory cell, information can be written in an amount twice as large as with a conventional memory cell under the same design rule.

Figure 3:
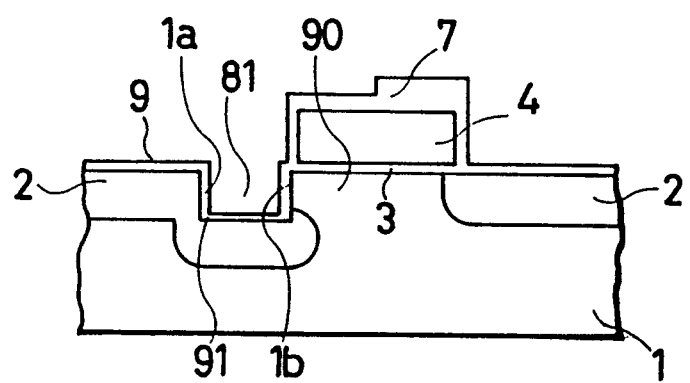
FIG. 3 is a schematic illustration showing a third step of a device fabrication process according to the embodiment of the invention.

In the present invention the source/drain regions are formed with use of a 0°-angle ion implantation technique in which impurity ions are implanted into a substrate along a normal with respect to the surface of the substrate. As shown in FIG. 3, one of the source/drain regions, which has the offset step portion, comprises a lower area just under the offset step portion and an upper area upwardly and diagonally extending from the lower area and including one of the side walls of the offset step portion, which side wall is spaced apart more than the other from a channel region between the source/drain regions. For forming the source/drain regions, the impurity ions are diffused preferably to a depth of 0.15–0.3 μm, and in this case the offset step portion has a depth of 0.1–0.25 μm, preferably 0.1–0.2 μm.

Hereinbelow, a method for fabricating a semiconductor device according to the present invention will be described with reference to the drawings.

Figure 1:
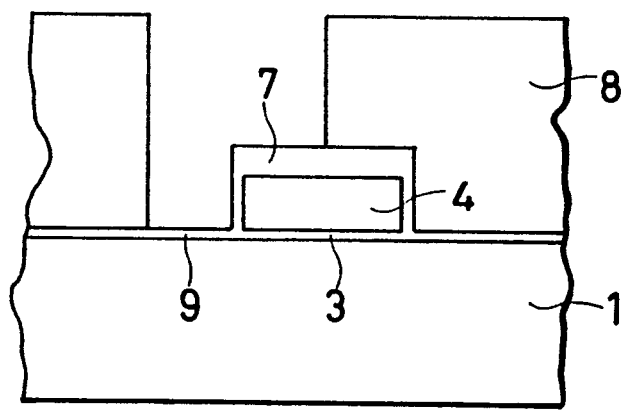
FIG. 1 is a schematic illustration showing a first step of a device fabrication process according to an embodiment of the invention.
Figure 2:
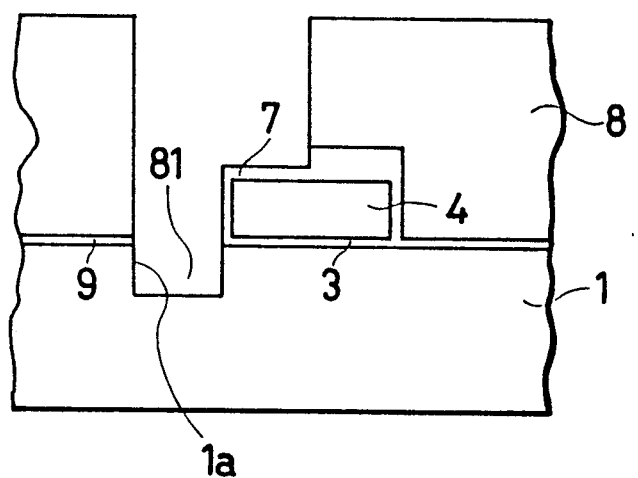
FIG. 2 is a schematic illustration showing a second step of a device fabrication process according to the embodiment of the invention; .

FIGS. 1–3 illustrate an embodied method for fabricating a semiconductor device according to the invention. Referring to FIG. 1, a gate electrode 4 such as of polysilicon is formed to have 3500 Å thick on a $SiO_2$ insulating film 9 of 200 Å thick covering a semiconductor substrate 1 of p-type conductivity. The gate electrode 4 is then covered with an insulating layer 7 (1200 Å thick) such as of $SiO_2$ in order not to be etched when the substrate 1 is etched by postetching. Thereafter, a resist pattern 8 is formed for defining an information-writing region.

Next, as shown in FIG. 2, the insulating film 9 is etched by an anisotropic reactive ion etching (RIE) until the substrate surface is exposed with use of the gate electrode 4 and the resist pattern 8 as a mask. In this case the gate electrode 4 can be sufficiently protected because the insulating layer 7 is made far thicker (1200 Å) than the insulating film 9 (200 Å). In turn, the exposed substrate is etched to 0.2 μm deep by an anisotropic RIE having a selective ratio of about 10 with respect to $SiO_2$ constituting the insulating layer 7 using the same mask as above, so that an offset step portion 81 is formed.

In turn, the resist pattern 8 is removed, then the offset step portion 81 is oxidized to form a $SiO_2$ insulating layer 91 over the entire inner surface of the offset step portion 81. Thereafter, an n-type impurity such as of As or P is doped at a high ion concentration $10^{15}$ ions/cm$^2$) with an accelerating energy of 80 KeV (As) or 60 KeV (P), with use of the gate electrode 4 and the insulting film 9 as a mask, followed by annealing at a temperature of 900° C. to form source/drain regions 2 as shown in FIG. 3. In this case the depth of the ion diffusion should be sightly larger than that of the offset step portion 81 so that the step portion 81 may not cut off the source/-drain region concerned (refer to FIG. 3). Further, such an ion implantation is desired to be 0° angle implantation so that the ions may not diffuse into a step wall 1b adjacent a channel region 90. Thus, a memory cell transistor is completed.

In the present embodiment an offset region is provided downwardly into one of intended source/drain regions of a semiconductor substrate for realizing offset between a gate electrode and one of the source/drain regions, and furthermore 0°-angle ion implantation is used for forming the source/drain regions, whereby a 2-bit memory cell transistor with a reduced size can be realized, which leads to a mass storage ROM.

Whole the present invention has been described with reference to a preferred embodiment thereof, it will be understood by those skilled in the art that various modification may be made in embodiments of the invention without departing from the spirit or scope of the invention.

What is claimed is:

1. A two bit memory cell semiconductor device for use as a mask ROM, comprising:

a semiconductor substrate;

a gate electrode formed on the substrate;

a pair of source/drain regions provided in the substrate; and an offset step region formed in at least one of the source/drain regions and downwardly extending into the substrate and substantially aligned with an edge of the gate electrode, wherein one bit of information may be read in one readout direction of the two bit memory cell and another bit of information may be read in the opposite readout direction.

2. A semiconductor device as set forth in claim 1, wherein a depth of said offset step portion is preset to be smaller than a depth that impurity diffusion for forming the source/drain regions can be diffused in said semiconductor substrate.

3. A semiconductor read only memory cell having bidirectional conduction properties, comprising:

a semiconductor substrate upon which is formed a layer of insulation;

a gate electrode formed on the insulation;

source and drain regions provided in the substrate, wherein the gate electrode is substantially aligned with one of the source and drain regions and is spaced apart by an offset groove formed in the substrate from the other of the source and drain regions such that the other source and drain region is separated from the gate electrode by the insulation layer and a channel region having the same impurity doping concentration as the substrate, wherein two bits of binary data may be stored in said semiconductor read only memory cell.

4. The memory cell according to claim 3 wherein the offset region is a groove formed in the substrate extending down into the other of the source and drain regions, the offset region being substantially aligned with an edge of the gate electrode.

5. The memory cell according to claim 3 wherein the depth of the offset groove is less than the depth of the impurity diffusion for forming the other drain and source region diffused in the semiconductor substrate.

6. The memory cell according to claim 3 wherein the gate electrode slightly overlaps the one source and drain region and one bit of information may be readout of the memory cell in one direction and another bit of information may be readout in the opposite direction.

7. The memory cell according to claim 6 wherein readout in the one direction is accomplished by applying a nonzero potential to the other source and drain region and a zero potential to the one source and drain region, and readout in the opposite direction is accomplished by applying a zero potential to the other source and drain region and a nonzero potential to the one source and drain region.

8. The semiconductor device according to claim 1 wherein the at least one of the source/drain regions is separated from the gate electrode by a substrate channel region.

9. The memory cell according to claim 1 wherein readout in the one direction is accomplished by applying a nonzero potential to the at least one of the source/drain regions and a zero potential to the other of the source/drain regions, and readout in the opposite direction is accomplished by applying a zero potential to the at least one of the source/drain regions and a nonzero potential to the other of the source/drain regions.

* * * * *